United States Patent
Garrigus et al.

[54] HIGH EFFICIENCY BROAD BAND TRAVELING-WAVE AMPLIFIER HARMONIC CONDITIONING

[75] Inventors: Walter E. Garrigus, Santa Ana; Murry I. Glick, Redondo Beach, both of Calif.

[73] Assignee: Aeronutronic Ford Corporation, Blue Bell, Pa.

[22] Filed: Oct. 21, 1974

[21] Appl. No.: 516,635

[52] U.S. Cl. ................................. 330/43
[51] Int. Cl.² ........................................... H03F 3/58
[58] Field of Search ........................................ 330/43

[56] References Cited
UNITED STATES PATENTS

| | | | |
|---|---|---|---|
| 3,237,121 | 2/1966 | Müller | 330/43 X |
| 3,426,291 | 2/1969 | Weglien et al. | 330/43 |

*Primary Examiner*—James B. Mullins
*Attorney, Agent, or Firm*—Robert D. Sanborn

[57] ABSTRACT

In a high efficiency amplifier system a Traveling-Wave Tube (TWT) power amplifier is driven to saturated output by a second TWT (driver TWT) which is preferably but not necessarily operated at saturation. Broad band operation, over two octaves, is achieved by harmonic conditioning. In addition to the usual phase shifter harmonic conditioner, an interstage equalizer and an input equalizer are added. The attenuation vs. frequency characteristic of each of these two equalizers is properly proportioned to cause the driver TWT to develop a specific desired ratio between harmonic amplitude and fundamental amplitude output at each frequency. When a specific driver and power amplifier TWT were operated in a laboratory test and the two equalizers were adjusted for optimum fundamental output power, the interstage equalizer had maximum attenuation at the second harmonic frequency (relative to the low frequency end of the operating band) and the input equalizer had maximum attenuation at the third harmonic frequency. Equalizer attenuation is selected to control the harmonic amplitudes for greatly improved performance over the lower frequency portion of the operating frequencies.

7 Claims, 5 Drawing Figures

HIGH EFFICIENCY BROAD BAND TRAVELING-WAVE AMPLIFIER HARMONIC CONDITIONING

BACKGROUND OF THE INVENTION

The traveling-wave tube (TWT) has been developed to where it is a very useful device operating over very great bandwidth and at high efficiency. The TWT employs an electron beam in association with an RF wave on a slow-wave electrical structure so that a substantial interaction occurs between the RF wave and the electron beam resulting in the RF wave being amplified. when the electron beam velocity is adjusted for maximum interaction, it is found that large amplification ratios can be achieved at reasonable beam values in reasonably small structures. Since extremely broad band slow-wave structures can be achieved and, since this is the only bandwidth limiting element in the tube, extremely broad-band amplifiers have become available.

Unfortunately, for such a TWT to operate efficiently, it must be operated at high RF levels. A high level signal entering the slow-wave RF structure will cause bunching of the electrons in the beam near the output end of the TWT because, as energy is transferred from the electron beam to the RF signal on the slow-wave structure, the electrons slow down in clusters in synchronism with the RF wave motion. If the RF input level is further increased, by the time the electron beam reaches the output end of the slow-wave structure it is completely bunched. For this condition further increase in the RF input signal will not result in a corresponding increase in output power. This condition is called "saturation".

For nearly complete bunching of the electron beam, it is clear that the bunching, as a function of applied energy, will be very nonlinear and the process will thus favor the generation of harmonics. For example, in a two-octave TWT, the lower frequencies are represented by at least four harmonics that fall inside the passband (the fundamental through the fourth harmonic thereof). At saturation the TWT will be capable of a particular power output value which is set by the beam power input multiplied by the tube efficiency. If the tube itself generates harmonic energy at its output, the output at the fundamental will be degraded thereby. For example, assume that a particular tube produces an output of 100 watts and that, due to its nonlinearity, the following harmonics are generated:

| Harmonic | % of Fundamental | Power (Watts) |
|---|---|---|
| Fundamental | 100 | 34.5 |
| 2nd | 81 | 27.8 |
| 3rd | 81 | 27.8 |
| 4th | 28 | 9.9 |
|  | Total | 100.0 |

It can be seen that if the tube produced no harmonics it would develop 100 watts of fundamental output. As it is, it only produces 34.5 watts or only slightly over ⅓ of its capability, a loss of almost 5dB. If the 2nd and 3rd harmonic power being developed in the tube could be eliminated, the output could be raised from 34.5 watts to 90 watts, an increase of over 4dB. This reduces the harmonic power being developed to less than 1dB.

The technique of harmonic conditioning has been developed to offset the above described effect of harmonic generation. In its simple form this consists of feeding a distorted signal (a signal which has harmonics) to the TWT. The distortion must be in the form of a harmonically related signal that is out of phase with the internally generated harmonic signal when it arrives at the TWT output. Thus the induced harmonic is used to offset or cancel the harmonic being internally generated. One method for doing this is to apply the TWT input to a frequency multiplier, the ouput of which is passed through a phase shifter and fed into the TWT. The phase shifter is set to produce the harmonic input signal phase that will cancel the locally generated harmonic near the output end of the TWT. An alternative approach is to drive a power amplifier TWT with a TWT driver. The tubes are designed so that both are normally operated near saturation. Thus the driver TWT will generate harmonics near the output end of its slow-wave structure. Then a harmonic phase shifter is interposed between the two TWT's. This phase shifter has a phase shift-versus-frequency characteristic that is linear and of a magnitude that causes harmonic phase inversion. Thus the harmonics generated in the first TWT are phase inverted so as to cancel the harmonics generated near the output end of the slow-wave structure of the second TWT.

The above approach to harmonic cancellation provides a substantial improvement in TWT performance but does not provide anything like the performance that should be available because it only conditions the phase of the harmonic signal being injected.

SUMMARY OF THE INVENTION

It is an object of the invention to more completely condition the harmonic signals applied to a TWT so as to reduce the degradation imposed by internal harmonic generation and thereby increase TWT amplifier efficiency.

It is a further object of the invention to increase overall TWT amplifier efficiency by harmonic conditioning, including control of the amplitude as well as the phase of the second and third harmonics in a two octave TWT amplifier.

These and other objects are achieved in an amplifier system arranged as follows. A TWT power amplifier is driven to saturation by means of a TWT driver that is caused to generate suitable harmonic levels by controlling its input drive which is varied as a function of frequency. The coupling between the driver TWT and the amplifier TWT is also varied as a function of frequency. A conventional harmonic phase shifter is interposed between the two amplifiers. This phase shifter is designed to act upon the harmonics present at the ouput of the driver TWT by shifting them in phase so that they cancel the harmonics generated within the amplifier TWT. In accordance with the invention, a first equalizer, having a specific selected attenuation at the fundamental frequency, is interposed between the two amplifiers. A second equalizer, having a specific selected attenuation at the fundamental frequency, is interposed between the driver TWT and its signal input circuitry. These equalizers are used to control the harmonic amplitudes so that the proper harmonic amplitude as well as the proper harmonic phase result in greatly improved harmonic cancellation in the amplifier TWT.

In the harmonics referred to above, the first harmonic or fundamental is considered to be the low end of the system passband. For two-octave system, control of the second and third harmonics provides adequate performance.

DESCRIPTION OF THE INVENTION

Figure 1A:
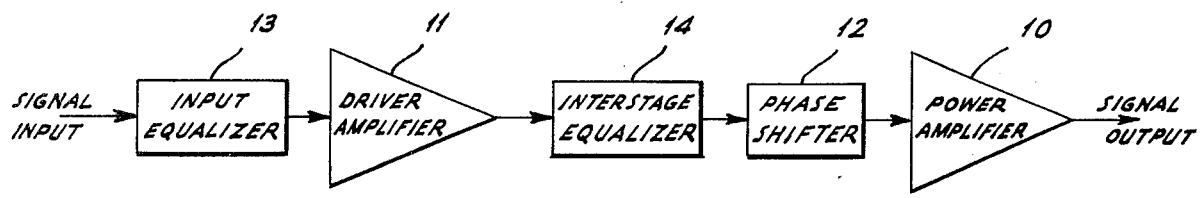
FIG. 1A is a block diagram showing the arrangement of components for practicing the invention.

FIG. 1 shows, in block diagram form, the arrangement of elements useful in practicing the invention. As described above, the prior art has shown a power amplifier TWT 10 being driven by a driver amplifier TWT 11 with a harmonic conditioning phase shifter 12 interposed therebetween. It is intended that the system operate over at least two octaves. TWT 10 is chosen so that it operates near saturation for normal signal use and therefore operates at high efficiency. High efficiency can be of great importance where energy is in short supply or is costly or difficult to deliver. For example in cramped aircraft or missile applications or in space communications satellites, efficient operation is of maximum importance. While not shown, the signal output of FIG. 1A could be an ECM antenna or a satellite antenna. The signal input, also not shown, could be the conventional well known, low-level signal generating means.

In accordance with the invention, an interstage equalizer 14 is connected between driver amplifier 11 and phase shifter 12. While it is shown between the phase shifter 12 and driver amplifier 11, it could be located between phase shifter 12 and power amplifier 10. The attenuation vs. frequency characteristic of this equalizer is chosen to cause driver TWT 11 to develop a specific desired ratio between harmonic amplitude and fundamental amplitude output at each frequency of operation. When the attenuation vs. frequency characteristic of equalizer 14 has been properly selected, the attenuation vs. frequency characteristic of equalizer 13 can be established, knowing the overall desired response characteristics of the entire amplifier and the characteristics of the input signal. This procedure results in the driver TWT 11 generating the proper harmonic amplitude at each frequency to cancel the harmonic amplitude generated internally by power amplifier 10. Thus when the proper harmonic amplitude is injected into TWT 10 and, when the phase shifter inverts the harmonic phase of the drive signals with respect to the phase of the internally generated output tube harmonics, nearly complete cancellation occurs. It should be noted that the important phase characteristic is to shift the phase of the harmonics generated by driver amplifier 11 by 180° with respect to where the harmonic is being generated in the power amplifier 10, e.g., near the output end.

EXAMPLE

An amplifier system was constructed as shown in FIG. 1A. Conventional coaxial cables and fittings were used to connect the various elements together. A Microwave Associates type number 2080 TWT was used as power amplifier 10. A Varian type number VTR 6003A3 was used as driver amplifier 11. A phase shifter 12 was constructed to have the phase-versus-frequency characteristics as shown by curve 12' of FIG. 1D. This curve was obtained by plotting the required phase shift to minimize harmonic generation. Interstage equalizer 14 was designed to have the characteristics of curve 14' of FIG. 1C. This characteristic was established by measurements at each frequency of the attenuation required to provide the proper harmonic amplitude. Equalizer 14 is specified as having a second harmonic attenuation peak of 6dB ± 2dB at a frequency of 2F ± 0.5F. With different tube (10 and/or 11) characteristics, this equalizer characteristic might have to have other values.

While shown as separate units, phase shifter 12 and equalizer 14 were actually constructed as a single unit. This omits the cable and fittings that would ordinarily be required to interconnect them.

Figure 1B:
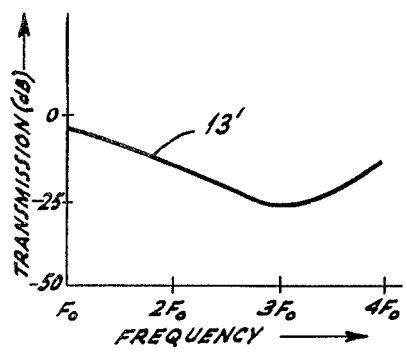
FIG. 1B shows the input equalizer characteristics used in a specific example.
Figure 1C:
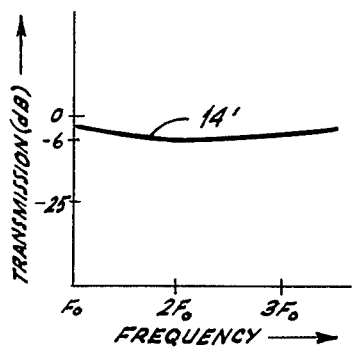
FIG. 1C shows the interstage equalizer characteristics used in the specific example.
Figure 1D:
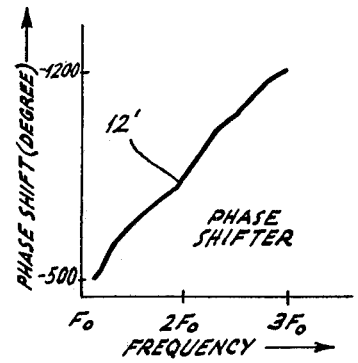
FIG. 1D shows the phase shifter characteristics used in the specific example.

Input equalizer 13 was designed to have the characteristic of curve 13' of FIG. 1B. Its characteristics were established using the method described for equalizer 14. Equalizer 13 is specified as having a third harmonic attenuation peak of 25dB ± 5dB at a frequency of 3F ± 0.5F. With different tube (10 and/or 11) characteristics, this equalizer characteristic might have to be varied from these values.

Figure 2:
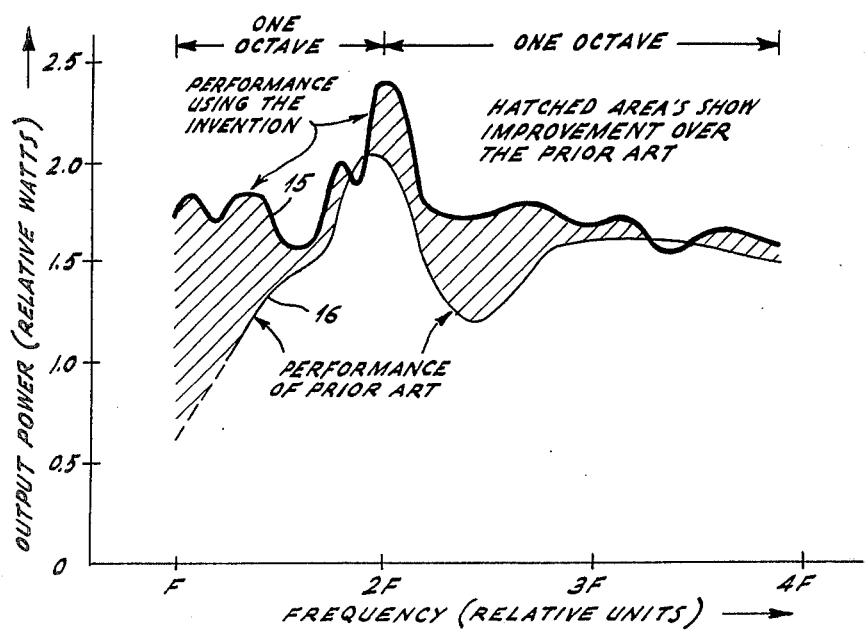
FIG. 2 is a graph showing the performance of the amplifier of FIG. 1A in comparison with the prior art for the specific example.

FIG. 2 shows the performance measured for the above-described amplifier system. Curve 15 represents the performance obtained by using the circuit of FIG. 1A and components having the characteristics denoted by the curves of FIG. 1B, 1C, and 1D. Curve 16 of FIG. 2, shows the performance of the prior art system wherein equalizers 13 and 14 are omitted. The hatching portrays the performance improvement obtained using the above described components in the invention. In the region below 2F it can be seen that the invention affords a substantial and useful improvement.

Our invention has been described and an example of its use has been shown wherein the improvement afforded is clearly demonstrated. A person skilled in the art will be aware of alternative embodiments and equivalents. Accordingly it is intended that our invention be limited only by the following claims.

We claim:

1. In a microwave signal amplifying system capable of amplifying signals over at least two frequency octaves, said system comprising a traveling-wave output amplifier driven at near saturation, a traveling-wave driver amplifier ooerated in a region that results in significant harmonic amplitude generation, and phase shifting means connected between said traveling-wave driver amplifier and said traveling-wave output amplifier, the improvement comprising:

first signal equalizing means connected to the input of said traveling-wave driver, said first signal equalizing means having an attenuation peak at a frequency $nf$, where $f$ is a frequency within and near the low frequency end of the passband of said output amplifier and $n$ is an integer selected from the integers 2 and 3, and second signal equalizing means connected between the output of said traveling-wave driver and the input of said traveling-wave output amplifier, said second equalizing means having an attenuation peak at a frequency $mf$, where $m$ is the other of said integers 2 and 3, the values of said attenuation peaks being selected to provide maximum harmonic cancellation in said system.

2. The improvement of claim 1 wherein said first signal equalizing means has an attenuation peak of a frequency approximately three times the frequency of the lowest frequency to be amplified by said system and said second signal equalizer means has an attenuation peak at approximately two times the frequency of the lowest frequency to be amplified by said system.

3. The improvement of claim 2 wherein said first signal equalizing means has substantially greater peak attenuation than that of said second signal equalizing means.

4. A high efficiency broadband signal amplifying system capable of operating over at least two octaves, said system comprising:
 a traveling-wave power amplifier operated at near saturated output conditions, said power amplifier being characterized as producing substantial harmonic signal output,
 a traveling-wave driver amplifier connected to drive said power amplifier, said driver amplifier selected to operate at a level that will produce significant harmonic amplitude when said power amplifier is driven at the desired level,
 a phase shifter connected between said driver amplifier and said output amplifier, said phase shifter having a phase shift versus frequency characteristic such that harmonics generated in said driver amplifier are applied to said power amplifier out of phase with said harmonics generated in said power amplifier,
 a first equalizer connected between said driver amplifier and said power amplifier, said first equalizer having an attenuation peak at a frequency $nf$, where $f$ is a frequency within and near the low frequency end of the passband of said output amplifier and $n$ is an integer selected from the integers 2 and 3, and
 a second equalizer connected to the input to said driver amplifier, said second equalizer having an attenuation peak at a frequency $mf$, where $m$ is the other of said integers 2 and 3, the values of said attenuation peaks and the attenuation versus frequency characteristic of said first and second equalizers being selected to control the generation of harmonic signal energy in said driver amplifier.

5. The system of claim 4 wherein said first equalizer has an attenuation peak at about the second harmonic of the lowest frequency to be amplified in said system and said second equalizer has an attenuation peak at about the third harmonic of the lowest frequency to be amplified in said system.

6. The system of claim 4 wherein said phase shifter and said first equalizer are combined into a single structural element connected between said power amplifier and said driver amplifier.

7. The system of claim 5 wherein said first equalizer has an attenuation peak of 6dB ± 2dB at a frequency of 2F ± 0.5F, and said second equalizer has an attenuation peak of 25dB ± 5dB at a frequency of 3F ± 0.5F, where F is the lowest frequency to be amplified in said system.

* * * * *